United States Patent [19]

Moslehi et al.

[11] Patent Number: 5,296,385
[45] Date of Patent: Mar. 22, 1994

[54] CONDITIONING OF SEMICONDUCTOR WAFERS FOR UNIFORM AND REPEATABLE RAPID THERMAL PROCESSING

[75] Inventors: Mehrdad M. Moslehi; John Kuehne; Lino Velo, all of Dallas, Tex.

[73] Assignee: Texas Instruments Incorporated, Dallas, Tex.

[21] Appl. No.: 845,118

[22] Filed: Mar. 3, 1992

Related U.S. Application Data

[63] Continuation-in-part of Ser. No. 815,653, Dec. 31, 1991.

[51] Int. Cl.$^5$ .............................................. H01L 21/31
[52] U.S. Cl. ..................................... 437/20; 437/241
[58] Field of Search ............... 437/225, 228, 229, 238, 437/241, 11, 12, 20; 148/DIG. 7, DIG. 15

[56] References Cited

U.S. PATENT DOCUMENTS

| | | | |
|---|---|---|---|
| 4,662,956 | 5/1987 | Roth et al. | 148/DIG. 7 |
| 4,687,682 | 8/1987 | Koze | 437/238 |
| 4,956,538 | 9/1990 | Moslehi | 219/121.6 |

FOREIGN PATENT DOCUMENTS

| | | | |
|---|---|---|---|
| 56-88322 | 7/1981 | Japan | 437/11 |
| 58-12331 | 1/1983 | Japan | 437/11 |
| 62-24631 | 2/1987 | Japan | 437/12 |

Primary Examiner—Olik Chaudhuri
Assistant Examiner—Ourmazd S. Ojan
Attorney, Agent, or Firm—Gary C. Honeycutt; Richard L. Donaldson; William E. Hiller

[57] ABSTRACT

Several process flows are proposed for achieving suitable wafer backside structures for integrated RTP-based device processing. The wafer backside conditions proposed here can be adapted for integrated fabrication process flows based on multiple integrated single-wafer and rapid thermal processing (RTP) cycles. These backside conditions ensure repeatable RTP uniformity and accurate pyrometry calibrations and measurements. The use of a highly doped layer near the wafer backside ensures negligible infrared transmission and repeatable RTP-based process uniformity, both for the high-temperature and the lower temperature RTP-based processes such as low-pressure chemical-vapor deposition of silicon. Two backside layers are used (oxide and nitride) to prevent dopant outdiffusion and backside oxide growth due to thermal oxidation. Moreover, the backside silicon nitride layer preserves uniform backside emissivity throughout the entire flow. This is due to the oxidation resistance and also etch resistance of silicon nitride. The backside structures disclosed prevent emissivity variations/drift during RTP and other device fabrication steps throughout an integrated flow.

2 Claims, 4 Drawing Sheets

CONDITIONING OF SEMICONDUCTOR WAFERS FOR UNIFORM AND REPEATABLE RAPID THERMAL PROCESSING This application is a Continuation-in-Part of application Ser. No. 07/815,653 entitled Conditioning of Semiconductor Wafers for Uniform and Repeatable Rapid Thermal Processing, filed on Dec. 31, 1991 Mehrdad M. Moslehi, John Kuehni and Lino Velo.

BACKGROUND OF THE INVENTION

Single-wafer rapid thermal processing (RTP) has become an important fabrication technology for various applications such as thermal oxidation and nitridation, epitaxial growth, junction annealing, silicide formation/anneal, CMOS (complementary metal-oxide-semiconductor) well formation, rapid thermal chemical-vapor deposition (RTCVC), and others. Major efforts have been made on full-flow single-wafer integrated processing such as in semiconductor minifactory and conventional factory environments. One important requirement in RTP is repeatable and accurate temperature measurement and control for uniform and repeatable RTP-based fabrication processes. To eliminate the wafer pattern and process-related effects on temperature measurement and controls, one approach has been to perform multi-point wafer temperature measurement via light pipes inserted into RTP illuminators and probing the wafer backside. Therefore, the condition of the wafer backside and any change in the backside characteristics during RTP can have strong effects on wafer temperature measurement accuracy and repeatability. Moreover, uniformity of the wafer backside emissivity and surface conditions usually have a strong impact on the pyrometry temperature measurement and therefore a strong impact on the RTP uniformity and wafer-to-wafer process repeatability. In an integrated semiconductor device fabrication flow, multiple RTP fabrication steps may be used. The conventional process integration technique, result in numerous changes in the wafer backside structure and emissivity due to deposition, growth, and etch processes. As a result, there is a need for proper pre-conditioning of the semiconductor wafer backsides to ensure repeatable and uniform backside emissivity with negligible variations and drifts during the integrated process steps. Wafers having a single silicon dioxide layer on the wafer backside can be purchased from commercial vendors. However, the single oxide layer only serves to prevent dopant outdiffusion (and therefore process and wafer cross-contamination) and does not address the other foregoing described needs of to produce uniform backside emissivity and surface conditions for RTP-based integrated processing.

DETAILED DESCRIPTION OF THE INVENTION

The following shall present process flows for pre-conditioning of semiconductor wafer backsides for both epi-type wafers and bulk wafers.

Backside preparation of this invention for epitaxial wafers is similar to backside wafer preparation for bulk wafers with the most salient distinction being the lack of additional backside doping (by ion implantation, gas-phase doping, or solid-source doping) during epitaxial preparation as compared with bulk wafer preparation.

The preferred process flow for conditioning the backside of an epitaxial wafer is as follows (assume the wafer have P$^-$ epitaxial layers on P+ substrates; N$^-$ epitaxy on N+ substrates may also be used).

Figure 1:
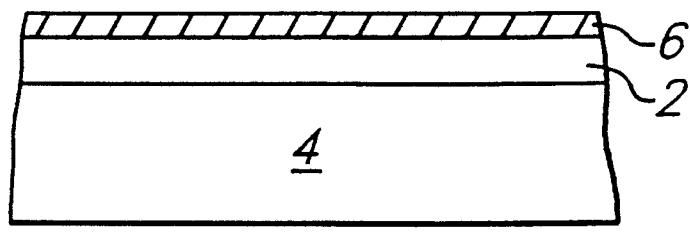
FIGS. 1 through 18 illustrate cross-sectional drawings of the semiconductor wafer structures produced from the invention's processing steps. Applicable reference numerals have been carried forward.

1) Starting with an epitaxial wafer, including lightly doped region 2 over highly doped substrate region 4, as shown in cross-section in FIG. 1, protective oxide layer 6 is deposited on the frontside of the wafer. This deposition may be accomplished by a method of single-wafer plasma-enhanced chemical-vapor deposition (PECVD), resulting in a protective oxide layer thickness of between 500 to 1000 Å.

Figure 2:
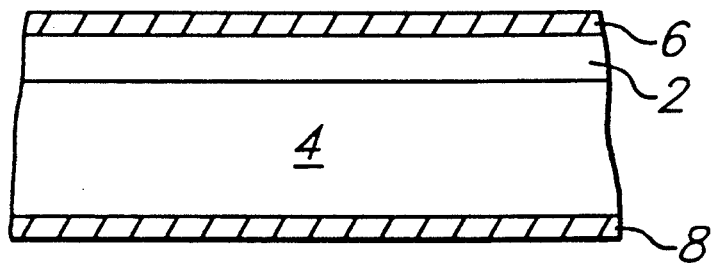
Figure 3:
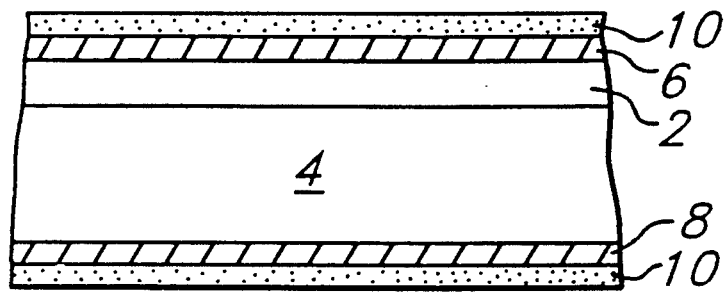

2) With reference to FIG. 2 which illustrates a cross-sectional drawing of the resulting structure, flip the wafer and deposit seal oxide 8 on the backside of the wafer via a single-wafer PECVD process. The resulting backside seal oxide is for instance, around 1000 Å thick.

3) With reference to FIG. 2 which illustrates a cross-sectional drawing of the resulting structure, deposit silicon nitride layer 10 on the wafer frontside and backside using low-pressure chemical-vapor deposition (LPCVD).

Figure 4:
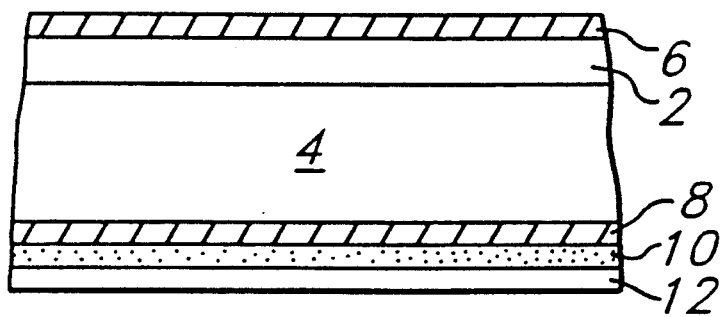

4) As illustrated in FIG. 4 which shows a cross-section of the resulting structure from the following process step, coat the back-side of the wafer with protective photoresist layer 12 and strip the frontside nitride layers using a selective etch such as plasma etch (the use of photoresist is optional if a one-sided plasma etch is used).

5) Strip the photoresist.

6) Strip the frontside oxide using a timed wet etch such as an HF etch. The HF etch will remove frontside oxide and only a small amount of backside nitride. This is due to the much slower nitride etch rates in HF-based etchants compared to the oxide etch rates. The resulting structure is illustrated in cross-section in FIG. 5.

Figure 5:
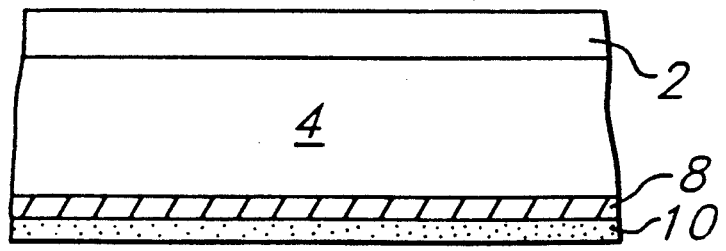
Figure 6:
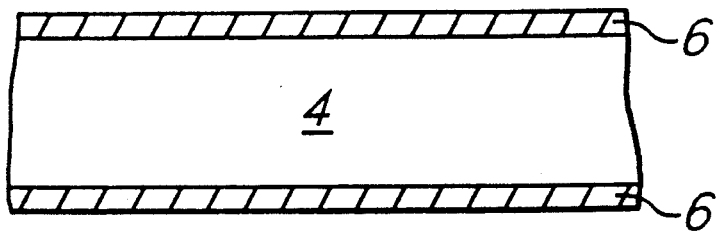
Figure 7:
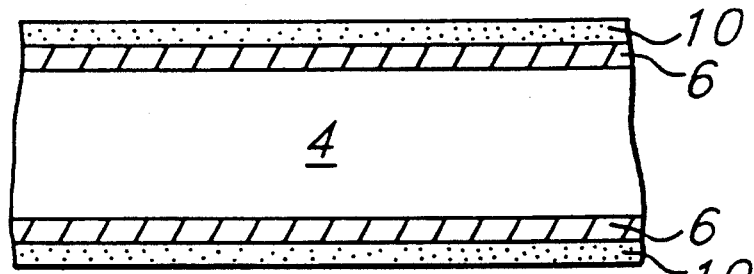
Figure 8:
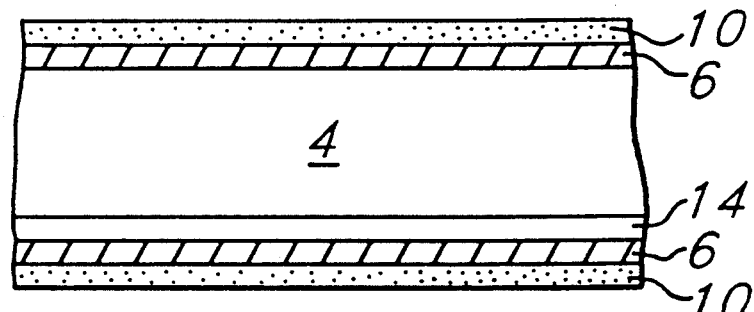
Figure 9:
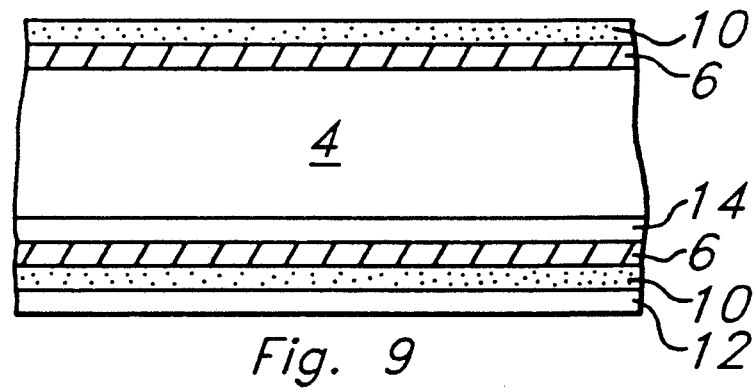
Figure 10:
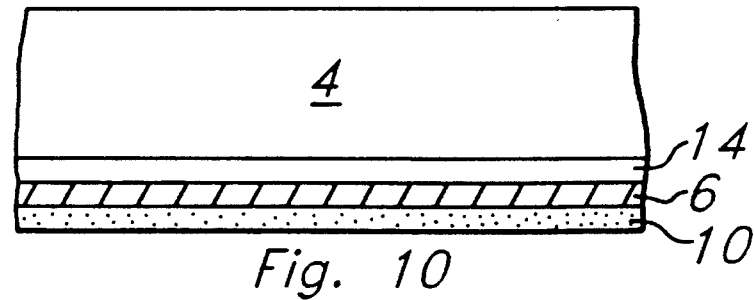
Figure 11:
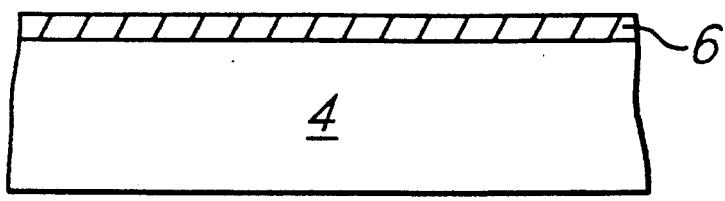
Figure 12:
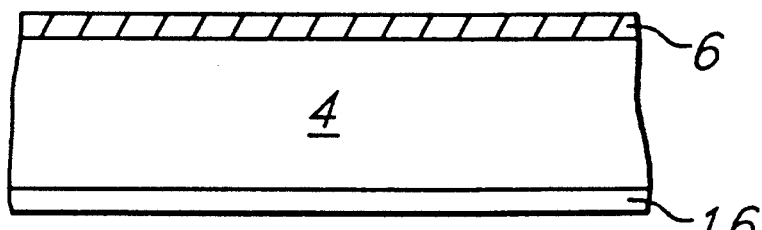
Figure 13:
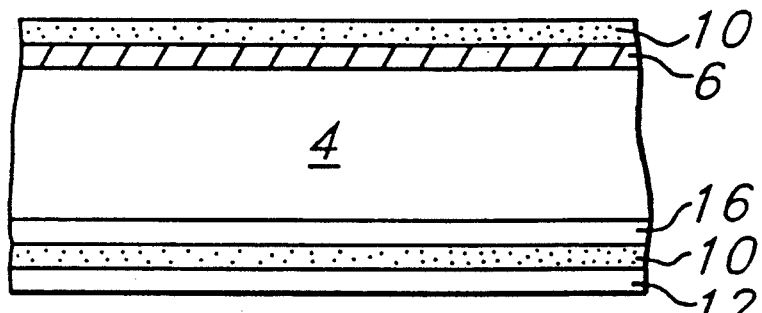
Figure 14:
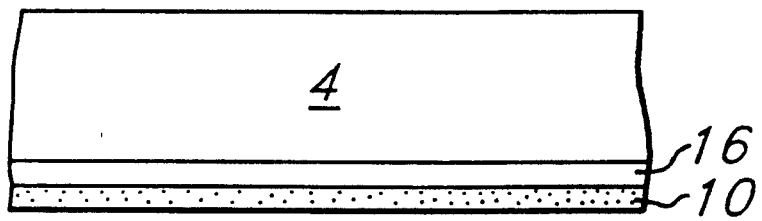
Figure 15:
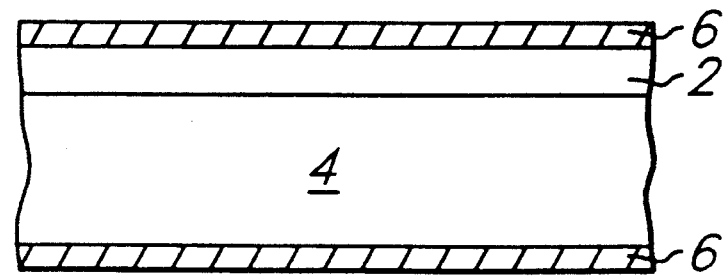
Figure 16:
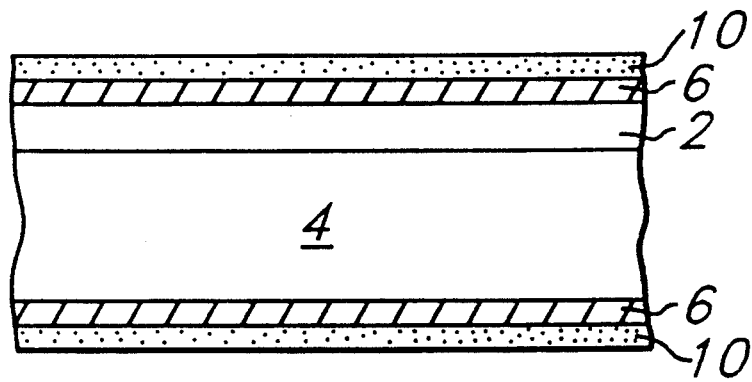
Figure 17:
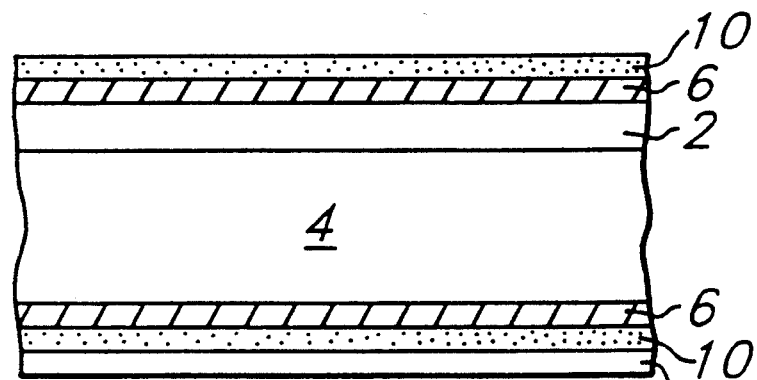
Figure 18:
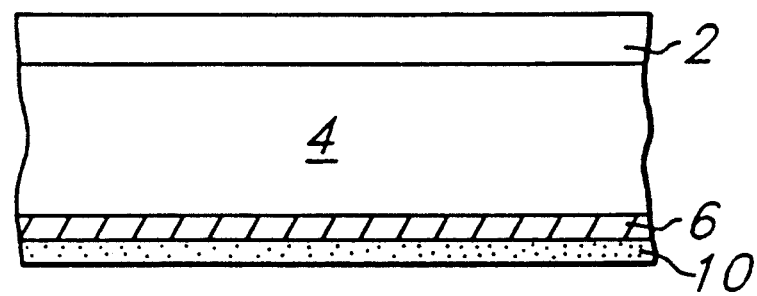

Note that there are several other possible fabrication methods for fabricating the wafer backside structure of FIG. 5. The above-mentioned flow is one possible method.

The following discloses a first preferred method of backside conditioning method which is applicable for bulk semiconductor wafers which are, for instance, lightly doped p (p-) or n (n-) type. This description is made with reference to FIGS. 6 through 10 which illustrate cross-sectional drawings of the resulting structure from the following process steps.

1) Deposit a layer of silicon oxide 6 on both top and bottom of the wafer using a well known LPCVD process such as with TEOS (tetra ethyl ortho silicate). Additionally, the oxide layer can be achieved using high-pressure thermal oxidation (HIPOX). The oxide thickness may be chosen to be 1000 Å.

2) Deposit a layer of silicon nitride 10 by LPCVD on the frontside and backside of the wafer. The nitride layer can be, for instance, 1300 Å thick.

3) Perform a backside ion implantation of p-type dopant boron for a p-substrate or alternatively, perform a backside ion implantation of n-type dopant (phosphorus) for a n- substrate. For instance, for a lightly doped p- substrate, the implant may comprise boron implanted at 200–400 KeV at $5 \times 10^{15}$ to $5 \times 10^{16}$ atoms per cm$^2$. A highly doped layer 14 is thus formed in the substrate backside by the foregoing steps.

4) Coat the backside of the wafer with photoresist 12 (optional).

5) Etch away frontside nitride layer 10. This can be accomplished by well known plasma etch techniques. If a one-sided plasma etch is used, the photoresist mask on the wafer backside may be eliminated.

6) Strip the frontside oxide layer 6 using HF etchant then strip photoresist 12.

7) Perform a pre-furnace clean of the wafer followed by an implant anneal to activate and drive in the backside dopant.

8) The wafer is now prepared for integrated RTP-based device processing. The backside p+ layer is used for preventing infrared energy transmission through the wafer. Pyrometry-based temperature measurements are very sensitive to wafer emissivity. The infrared emissivity values are also dependent on the wafer bulk doping, unless the bulk (or at least a fraction of its thickness) is heavily doped. Therefore, the wafer is more opaque with a p+ or n+ doped layer on its backside. Consequently, it is preferred that the wafer backside is opaque. The oxide/nitride stack prevents p+ dopant outdiffusion and cross-contamination effects of boron during high-temperature thermal processing. Further, these layers prevent oxide growth on the wafer backside due to the oxidation resistance of silicon nitride. Note that the backside oxide/nitride layers remain intact and uniform during the integrated process flow all the way through the final fabrication steps. The oxide/nitride layers on the backside can be removed before a final backside metallization. These conditions simplify pyrometry-based temperature measurements and calibration during integrated single-wafer processing using multiple RTP steps. If desired, the high-temperature annealing required for introducing the highly concentrated dopant (i.e. boron) into the wafer backside (or forming the highly doped layer near the wafer backside (i.e. a p+ layer on the backside) can be combined with an intrinsic gathering thermal cycle. This will eliminate the need for a separate thermal anneal step. It is also possible to use some permanent backside damage (e.g. using heavy dose mega-electron-volt ion implantation of a suitable element such as carbon or argon) in order to form the infrared blocking layer (instead of P+ or N+ doped layer).

The following discloses a second preferred backside conditioning method which is applicable for bulk non-epitaxial semiconductor wafers. This description is made with reference to FIGS. 7 through 14 which illustrate cross-sectional drawings of the resulting structure from the following process steps.

1) Preclean wafer and follow the preclean with the formation of oxide 6 on the frontside (only) of the wafer. For instance, an oxide thickness of approximately 1000 Å can be achieved using single-wafer or PECVD.

2) Deposit approximately 0.5-1 $\mu$m borosilicate glass (BSG) 16 which has 4-10% boron doping on the wafer backside. Alternatively the BSG layer can be deposited, using a furnace, on both sides of the wafer. The BSG layer serves as a dopant source for wafer backside doping as well as a buffer layer under a subsequent silicon nitride.

3) Deposit approximately 1300 Å of silicon nitride 10 by a method of LPCVD on both sides of the wafer.

4) Coat the wafer backside with photoresist 12.

5) Etch the front nitride layer. This can be accomplished by well known selective plasma etch methods.

6) Strip the front oxide layer 6 and then strip resist 12.

7) Clean the wafer for the furnace use followed by an anneal at, for instance, 1000°–1100° C., to form a blanket p+ doped layer 17 on the wafer backside.

8) The wafer is now ready for integrated device processing including multiple RTP steps.

An alternative method for conditioning the backside structure of an epitaxial wafer is presented below with reference to the cross-sectional drawings of the structure resulting from processing steps illustrated in FIGS. 15–18.

1) Deposit, on the wafer backside and frontside, an approximately 1000 Å thick layer of oxide 6 by LPCVD or alternatively form the oxide by thermal oxidation.

2) Deposit an approximately 1000–1300 Å thick layer of silicon nitride 10 on the frontside and backside of the wafer by a method of LPCVD.

3) Coat the wafer backside with photoresist 12.

4) Etch nitride 10 from the wafer frontside. For instance, well-known selective plasma etch techniques can be used.

5) Strip the front oxide 6 (using a wet HF-based etchant).

6) Strip resist 12.

7) Clean the wafer for use the subsequent device fabrication steps

8) The wafer is now ready for integrated RTP.

In order to achieve excellent RTP uniformity and wafer-to-wafer fabrication process repeatability, the uniformity of the backside oxide and nitride layer thickness should be as high as possible. This will ensure uniform and repeatable emissivity conditions for all the wafers so as to achieve accurate and repeatable wafer temperature measurements and repeatable process and uniformity control.

ADVANTAGES OF THE INVENTION

The invention provides advantages which include the following:

1. Uniform and repeatable backside emissivity values are provided.

2. Constant backside layers through the integrated process flow are provided thus yielding a non-varying wafer backside structure and repeatable emissivity.

3. A diffusion barrier against outdiffussion of the substrate dopant is provided due to the presence of oxide/nitride stack.

4. Oxidation resistance of the backside nitride (e.g. during field oxidation) prevents growth of oxide on the backside during various thermal oxidation fabrication steps throughout the flow.

5. The nitride/oxide stack is a much better diffusion barrier than just oxide against dopant outdifussion, thus eliminating any cross-contamination effects.

6. The backside nitride remains intact throughout the integrated flow since negligible nitride etch occurs various plasma and wet oxide etch steps throughout the device fabrication flow. The preferred integrated process flow methodology associated with the semiconductor wafer with the backside structures of this invention is such that is ensures preservation of the backside nitride/oxide/doped S: structure during the device fabrication flow. Moreover, the top layer of nitride remains as the topmost layer prior to and during each RTP step. For example, single-wafer LPCVD and PECVD processes are normally capable one-sided deposition techniques and do not deposit anything on the wafer backside. This is advantageous since no subsequent extra process step will be needed to restore the original backside nitride/oxide condition. However, batch LPCVD process typically result in two-sided depositions. For instance, a furnace LPCVD polysilicon process deposits polysilicon layer on both the frontside and backside surface. As a result, a subsequent process step will be needed to strip the backside polysilicon (e.g. using a photoresist mask on the frontside) in order to restore the backside nitride/oxide condition prior to the next RTP step. It is clear that in a fully single-wafer factory where all the LPCVD and PECVD processes result in one-sided (frontside) deposition, no extra fabrication steps are required for restoring or preserving the backside nitride/oxide condition. The thermal oxidation steps (such as field oxidation) grow an extremely thin layer of oxide (e.g. <100 Å) on the backside nitride due to the oxidation resistance of nitride. The repeated thermal oxidation and oxide deglaze steps in an integrated fabrication flow (such as a CMOS process) will result in some nitride thickness loss. However, the total nitride loss throughout the entire flow will be a small fraction of the original nitride thickness (<5-10% of the original thickness).

If the integrated flow employs an LPCVD silicon nitride process (e.g. for spacer or local oxidation mask) which is done in a furnace (two-sided deposition), an extra process step is used to form a thin (<500 A) layer of a suitable etch-stop material layer on the backside before the two-sided nitride deposition. A subsequent backside selective nitride etch can be used to remove the topmost backside nitride using the backside thin polysilicon layer as an etch-step layer. This etch-stop layer is subsequently removed using a selective silicon etch in order to restore the desired original backside nitride/oxide structure. Again, these extra process steps will not be needed if single-wafer one-sided LPCVD and PECVD are used.

Although the invention has been described in detail herein with reference to its preferred embodiment and certain described alternatives, it is to understood that this description is by way of example only and it is not to be construed in a limiting sense. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the true scope and spirit of the invention as claimed below.

I claim:

1. A fabrication method for semiconductor wafer backside preparation for integrated device processing comprising:
   heavily damaging said wafer backside to prevent infrared light transmission through said wafer; and
   forming a top layer of silicon nitride over the wafer backside.

2. A fabrication method for semiconductor wafer backside preparation for integrated device processing comprising:
   heavily doping said wafer backside to prevent infrared light transmission through said wafer; and
   forming a top layer of silicon nitride over the wafer backside.

* * * * *